United States Patent
Saito et al.

(10) Patent No.: US 7,219,785 B2
(45) Date of Patent: May 22, 2007

(54) WORK TRANSFER APPARATUS

(75) Inventors: Atsushi Saito, Saitama (JP); Akira Kimura, Tokyo (JP)

(73) Assignee: Sony Corporation (JP)

( * ) Notice: Subject to any disclaimer, the term of this patent is extended or adjusted under 35 U.S.C. 154(b) by 165 days.

(21) Appl. No.: 10/991,873

(22) Filed: Nov. 19, 2004

(65) Prior Publication Data
US 2005/0167238 A1     Aug. 4, 2005

(30) Foreign Application Priority Data
Nov. 28, 2003    (JP)    ............. P2003-400331

(51) Int. Cl.
*B65G 47/29* (2006.01)
(52) U.S. Cl. ............... 198/345.1; 198/459.6; 198/459.7; 198/738; 198/747
(58) Field of Classification Search ............ 198/345.1, 198/461.2, 459.6, 459.7, 736, 738, 747
See application file for complete search history.

(56) References Cited

U.S. PATENT DOCUMENTS 6,374,729 B1 * 4/2002 Doyle ................. 101/114

FOREIGN PATENT DOCUMENTS

| JP | A-2-229499 | 9/1990 |
| JP | HEI 3-124798 | 5/1991 |
| JP | HEI 4-291800 | 10/1992 |
| JP | A-6-336351 | 12/1994 |
| JP | HEI 11-163595 | 6/1999 |
| JP | 2001-144494 | 5/2001 |

* cited by examiner

*Primary Examiner*—Mark A. Deuble
(74) *Attorney, Agent, or Firm*—Rader Fishman & Grauer PLLC; Ronald P. Kananen

(57) ABSTRACT

A work transfer apparatus configured to move a work to an operating position while transferring the work by a conveyor, perform predetermined processing at the operating position, and discharge a processed work, the work transfer apparatus comprising an ejector moving the work independently from the conveyor; and a stopper stopping the work at the operating position, wherein the work processed by the predetermined processing is discharged by the ejector, and a work to be moved to the operating position next by the conveyor is stopped at the operating position by the stopper.

8 Claims, 7 Drawing Sheets

WORK TRANSFER APPARATUS

CROSS REFERENCES TO RELATED APPLICATIONS

The present document is based on Japanese Priority Document JP 2003-400331, filed in the Japanese Patent Office on Nov. 28, 2003, the entire contents of which being incorporated herein by reference.

BACKGROUND OF THE INVENTION

1. Field of the Invention

The present invention relates to a work transfer apparatus and, more particularly, to a work transfer apparatus which is constructed to move a work to an operating position while transferring the work by means of a conveyor, performs predetermined processing at this operating position, and discharges the processed work.

2. Description of Related Art

Component mounters are widely used in order to mount components on circuit boards and fabricate electronic circuits. A component mounter is provided with a suction nozzle at one end of a mount head, and causes this suction nozzle to attract a component by suction and moves the suction nozzle to a position above a predetermined mounting position on a circuit board by moving the suction nozzle in the X-axis and Y-axis directions relative to the circuit board. Then, the component mounter moves the suction nozzle down toward the circuit board, and mounts the attracted component on the circuit board at a predetermined position thereof.

This component mounter needs to sequentially transfer circuit boards to a mounting position below the mount head, and is provided with a board transfer system for this purpose. Board transfer systems are generally classified into two kinds: that is to say, a type which performs component mounting by moving the position of a board together with a conveyor, as represented by a rotary machine, and a type which performs component mounting with a board fixed in position. However, in the first type as well, since boards connected to conveyors fixed at preceding and succeeding positions need to be replaced when boards are to be replaced, the transfer of boards is under the same conditions except the time necessary for this connection is added.

As described above, a conveyor for transferring circuit boards on which components are to be mounted in the component mounter is made of three kinds of conveyors which are a conveyor provided at a component mounting position and conveyors provided at positions preceding and succeeding the component mounting position. The outline of operation to be started during the state in which the next board is waiting while components are being mounted on a board will be described below.

a. After the mounting of components on a board has been completed, the board is released from a clamp, a backup, positioning pins and the like.

b. The conveyor provided at the component mounting position starts to move, and the board on which the components have been mounted starts to move.

c. When it is detected that the rear end of the board has come out of the conveyor provided at the component mounting position, a stopper moves upward.

d. After it is confirmed that the stopper has moved up, the conveyor preceding the component mounting position is started to initiate loading the next board.

e. Before the board reaches the stopper, the conveyor is decelerated by means of a sensor, a timer and the like, and the board is made to stop in the state of being lightly pressed against the stopper and the conveyor is also made to stop.

f. A positioning pin is moved upward to perform clamping and backup, thereby completing the replacement of the boards.

A beam-transfer board transfer system which is said to be shorter in board replacement time than the above-mentioned board transfer system made of conventional conveyors are disclosed in, for example, Japanese Laid-Open Patent JP-A-6-336351 and Japanese Laid-Open Patent JP-A-2-229499. This system is shorter in the time required for replacement of boards than the above-mentioned conveyor system. Similarly to the conveyor system, this beam-transfer system is provided with three kinds of conveyors. Incidentally, a conveyor provided at an intermediate mounting position only supports a board and generally does not have the ability to move a board autonomously. The beam-transfer system has a stroke equal to a maximum of the length of a board in the flowing direction of boards, and includes a beam mechanism having two board feed claws. The outline of operation to be started during the state in which the next board is waiting while components are being mounted on a board will be described below.

a. After the mounting of components on a board has been completed, the board is released from a clamp, a backup, positioning pins and the like.

b. Two board feed claws are inserted into a position where they can press the rear end of the board on which the components have been mounted and the rear end of the next board, by a method such as rotating a beam provided outside a conveyor.

c. The beam starts to move in the flowing direction of boards, and discharges the board on which the components have been mounted, from a component mounting area, and at the same time completes the operation of transferring the next board to a component mounting position.

d. A positioning pin is moved upward, and while the positioning pin is being made to perform clamping and backup, the claws are retracted and the beam returns to its original position, whereby the replacement of the boards is completed.

This beam-transfer system is considered to be theoretically capable of completing replacement of boards in the shortest time because both boards are moved at the same time. However, as shown by the fact that the beam-transfer system is not used as a normal system, the beam-transfer system has a number of disadvantages. The disadvantages are as follows.

a. In the case where discharging and loading cannot be performed at the same time, the discharging of a board on which components are mounted is first completed, and after a beam has been returned, claws have to be inserted after the next incoming board. As a result, there are cases where the beam-transfer system becomes slower than ordinary systems.

b. The beam-transfer system has the disadvantage of being large sized and difficult to install, for reasons such as: since two claws are integrated in the form of being separated from each other by a distance equal to a maximum board length, insertion and retraction of the claws is necessary and the beam has a stroke equal to a maximum board length.

c. Since two boards need to be pressed by the beam at the same time, the position of the claws needs to adjusted according to the size of boards.

The above-mentioned problem a in particular may be a fatal disadvantage even if the demerits of the other problems are accepted in order to adopt the beam-transfer system to shorten component replacement time.

[Patent Document 1] Japanese Patent Application publication (KOKAI) No. Hei 6-336351
[Patent Document 2] Japanese Patent Application publication (KOKAI) No. Hei 2-229499
[Patent Document 3] Japanese Patent Application publication (KOKAI) No. Hei 11-163595
[Patent Document 4] Japanese Patent Application publication (KOKAI) No. Hei 3-214798
[Patent Document 5] Japanese Patent Application publication (KOKAI) No. Hei 4-291800
[Patent Document 6] Japanese Patent Application publication (KOKAI) No. 2001-144494

SUMMARY OF THE INVENTION

It is desirable to provide a work transfer apparatus which is capable of reducing work replacement time.

Further it is desirable to provide a work transfer apparatus which is constructed to solve the disadvantages of beam-transfer systems.

Further it is desirable to provide a work transfer apparatus which is capable of introducing the next work even if an ejector does not return to its original position in the case where discharging and loading of works cannot be performed at the same time.

Further it is desirable to provide a work transfer apparatus which is capable of efficiently performing replacement of works even if the stroke of an ejector is short.

Further it is desirable to provide a work transfer apparatus which is constructed so that the position of an ejector need not be adjusted, irrespective of the dimension of each individual work in the transfer direction thereof.

The above and other objects of the invention of the present application will become apparent from the following description of the technical idea of the present invention and a mode for carrying out the present invention.

According to an embodiment of the present invention, there is provided a work transfer apparatus which is constructed to move a work to an operating position while transferring the work by means of a conveyor, perform predetermined processing at the operating position, and discharge the processed work, the work transfer apparatus including:

an ejector moving the work independently from the conveyor; and a stopper stopping the work at the operating position, wherein the work processed by the predetermined processing is discharged by the ejector, and a work to be moved to the operating position next by the conveyor is stopped at the operating position by the stopper.

The discharging speed at which the work processed by the predetermined processing is discharged by the ejector may be set to be larger than the moving speed of the next work to be moved to the operating position by the conveyor. In addition, the discharging speed at which the work processed by the predetermined processing is discharged by the ejector may be made larger than the speed of transfer of works by the conveyor so that a space is formed between the processed work and the next work to be processed and the stopper is inserted into the space. In addition, the transfer speed of the next work to be processed may be accelerated and decelerated independently by the conveyor so that the next work is made to stop by coming into abutment with the stopper. In addition, the ejector maybe supported for free movement on a rail disposed to extend in the running direction of the conveyor and be moved on the rail by reciprocating motion of a belt, and the rail may be displaced in a direction crossing the conveyor by an actuator so that the ejector is projected at a position where the ejector engages with the work. In addition, the stopper may be disposed at a predetermined position in the transfer path of a work moved by the conveyor, and the stopper may be displaced in a direction crossing the conveyor by the actuator so that the stopper is projected at a position between the stopper comes into abutment with the work.

According to another embodiment of the present invention there is provided a work transfer apparatus which is constructed to move a work to an operating position while transferring the work by means of a conveyor, perform predetermined processing at the operating position, and discharge the processed work, the work transfer apparatus including:

an ejector for moving the work independently from the conveyor; and a stopper for stopping the work moved independently from the conveyor and transferred to the operating position, wherein the work processed by the predetermined processing is discharged by the ejector, and the stopper is moved between the work processed by the predetermined processing and a work next to be transferred to the operating position to stop the work next to be transferred to the operating position at a predetermined operating position.

The ejector and the stopper may be made to move at mutually independent speeds. In addition, the ejector and the stopper may be respectively supported for free movement on rails disposed to extend in the running direction of the conveyor and are respectively moved on the rails by reciprocating motion of belts, and the respective rails may be displaced in directions crossing the conveyor by actuators so that the ejector and the stopper are respectively projected at positions where the ejector and the stopper engage with the work. In addition, the work may be a circuit board, and components may be mounted on the circuit board at the operating position.

According to another embodiment of the present invention there is provided a work transfer apparatus which is constructed to move a work to an operating position while transferring the work by means of a conveyor, perform predetermined processing at the operating position, and discharge the processed work, and the work transfer apparatus includes an ejector for moving the work independently from the conveyor, and a stopper for stopping the work at the operating position, and is constructed to stop a work next to be moved to the operating position by the conveyor at the operating position.

According to the work transfer apparatus, while the work processed by the predetermined processing is being discharged by the ejector, the work next to be processed can be introduced by the conveyor, and it is possible to approximately accurately position the next work at the operating position by stopping the conveyor introduced at the operating position.

According to another embodiment of the present invention there is provided a work transfer apparatus which is constructed to move a work to an operating position while transferring the work by means of a conveyor, perform predetermined processing at the operating position, and discharge the processed work, and the work transfer apparatus includes an ejector for moving the work independently from the conveyor, and a stopper for stopping the work moved independently from the conveyor and transferred to the operating position, the work processed by the predetermined processing being discharged by the ejector, and the stopper being moved between the work processed by the predetermined processing and a work next to be transferred to the operating position to stop the work next to be transferred to the operating position at a predetermined operating position.

According to the work transfer apparatus, the work processed by the predetermined processing is discharged by the ejector, and in addition, a work next to be processed is introduced by the conveyor and the work is independently moved and brought into abutment with the stopper on standby, whereby the next work can be stopped at the predetermined operating position.

BRIEF DESCRIPTION OF THE DRAWINGS

The above and other objects, features and advantages of the present invention will become more apparent from the following description of the presently preferred exemplary embodiment of the invention taken in conjunction with the accompanying drawing, in which.

DETAILED DESCRIPTION OF THE EMBODIMENTS

Figure 1:
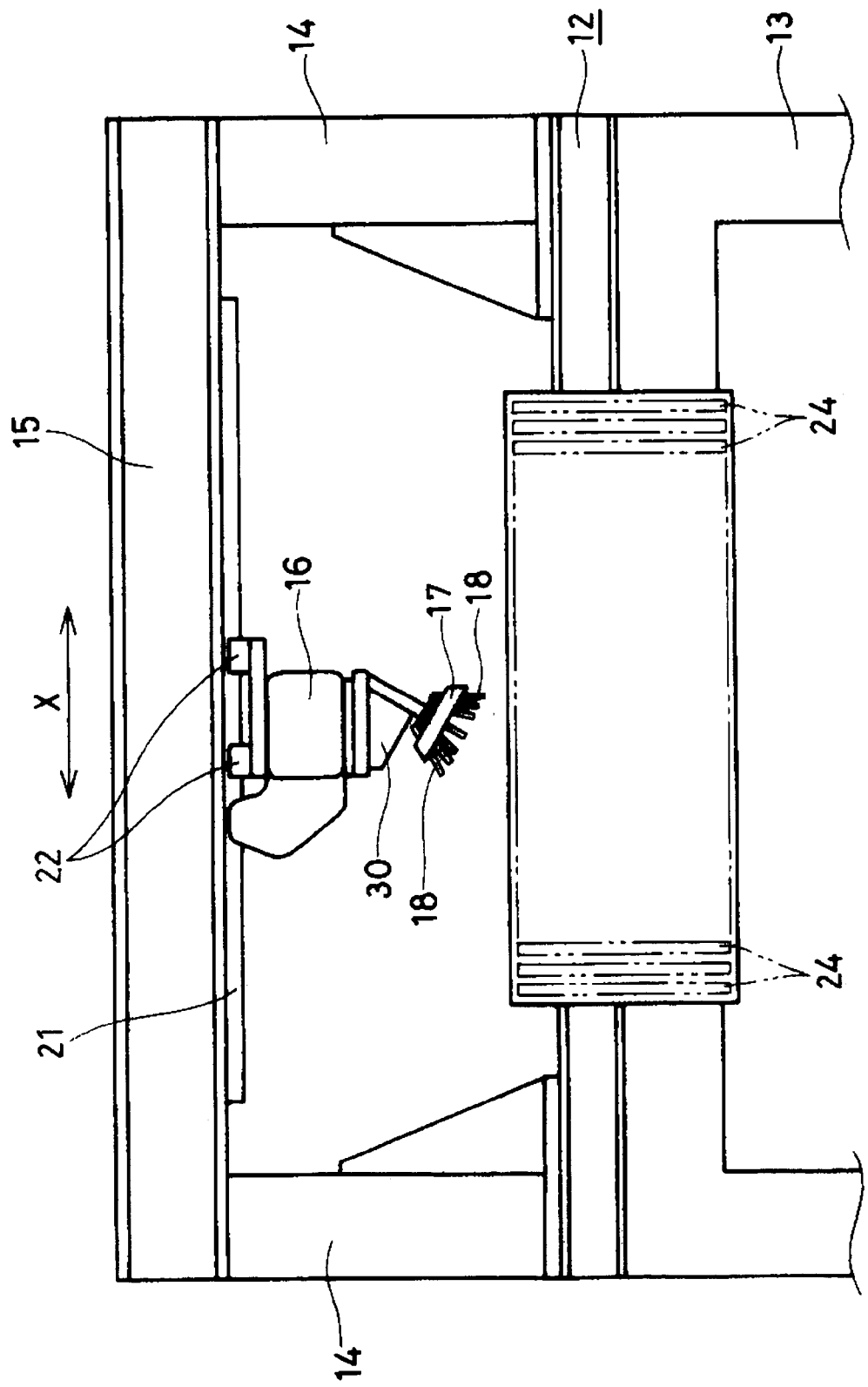
FIG. 1 is a front view showing an entire configuration of a mounter.

Embodiments of the present invention will be described below with reference to FIG. 4. FIG. 4 shows a mechanism and a method for simultaneously moving a circuit board 19a on which components are mounted and a circuit board 19b on which components are to be mounted next, and these mechanism and method use an ejector 35 which moves together with conveyors 31, 32 and 33, to realize the maximum advantage of beam transfer; that is to say, the state in which even if the incoming board 19b and the outgoing board 19a are simultaneously moved, no contact occurs at all between the boards 19a and 19b. In addition to this status, even in the case of simultaneous activation, the ejector 35 is moved and stopped ahead of the incoming board 19b, or a stopper 37 is lifted.

The incoming board 19b is transferred by being accelerated and decelerated independently by the conveyors 31 and 32, and realizes the state of abutting on the stopper 37 which is stopped. Accordingly, even if simultaneous activation is not performed and the incoming board 19b comes in late, no losses occur at all unlike the case of beam transfer, whereby it is possible to realize a system capable of constantly executing processing at maximum speed even in terms of either loading or discharging.

This system having the belt conveyors 31, 32 and 33 is further provided with an actuator 36 which moves in the flowing direction of the boards 19a and 19b. The ejector 35 is attached to the actuator 36, and until the board 19a having components mounted thereon is discharged, the ejector 35 is lifted in the space between the board 19a having components mounted thereon and the board 19b on which components are to be mounted next, so that the ejector 35 can act on the two boards 19a and 19b. In addition, until the ejector 35 placed on the actuator 36 discharges the board 19a having components mounted thereon, the ejector 35 is lifted in the space between the board 19a having components mounted thereon and the board 19b on which components are to be mounted next, and is placed in abutment with both boards 19a and 19b.

Then, the ejector 35 is combined with the actuator 36 to realize the start of simultaneous movement of the board 19a having components mounted thereon and the board 19b on which components are to be mounted next. Namely, the ejector 35 is moved by the actuator 36 so as to be moved and stopped at its original position, i.e., a position where the board 19b on which components are to be mounted next is to be stopped (refer to FIG. 4B).

The ejector 35 is moved by the actuator 36 at a speed faster than the conveyors 31, 32 and 33. Then, when the ejector 35 presses the board 19a furthest to a position which the stopper 37 can be lifted, the stopper 37 is lifted. The reason why the stopper 37 can be lifted without the risk of thrusting up the incoming board 19b is that the acceleration and the maximum speed of the ejector 35 are higher than those of the conveyors 31, 32 and 33 so that the ejector 35 moves ahead of the incoming board 19b to form a space in which the stopper 37 can be lifted. In addition, there is also a method of adjusting the length of the ejector 35 in the moving direction as well as the speed of the ejector 35 to lift the stopper 37 within a time during which the width of the ejector 35 is passing through a position lateral to one side of the stopper 37. In this case, no limitations are imposed on the relationship in speed between the conveyors 31, 32 and 33 and the ejector 35.

How to handle the flowing direction of the conveyors will be considered below. In the case where the conveyors flow from the right to the left in FIG. 4; that is to say, the origin of the circuit boards 19a and 19b is located at the right end, if these boards 19a and 19b are small sized, the stopper 37 is brought into the state in which when the next incoming board 19b reaches the stopper 37, the board 19a to be discharged at this time is not yet moved out of a component mounting area and the stopper 37 is forced to wait without being permitted to effect a backup or the like. To prevent the occurrence of this state, a system can be added which separates the two boards 19a and 19b from each other and presses the outgoing board 19a out of the component mounting area when the stopper 37 is to be lifted and stopped. Even if the boards 19a and 19b are small sized, the ejector 35 continues to move even after having passed through the position lateral to the one side of the stopper 37, and discharges the outgoing board 19a from a board positioning area, whereby losses can be minimized.

On the other hand, in the case where the conveyors flow in the opposite direction to that of FIG. 4 from the left to the right; that is to say, the origin of the boards is located at the left end, at the time when the stopper 37 reaches its stop position, the board 19a is previously discharged from the component mounting area, so that no measures are necessary. In addition, at the time when the stopper 37 is to be lifted, the outgoing board 19a is previously discharged from the component mounting area, so that no measures are necessary.

A method of minimizing the loading time of the board 19b on which components are to be mounted next will be described below. In the ordinary board transfer system mentioned above as the related art, it is also desired to move the boards fully fast, but the boards must be brought into abutment with the stopper 37 with a fully small impact. However, these contradictory problems: fast speed and small impact, can be coped with by decelerating the conveyors by means of a sensor or a timer. Accordingly, in the mode for carrying out the present invention as well, a method similar to this method is used to achieve the time minimizing method.

The acceleration and deceleration of the incoming board 19b is performed by friction between the conveyors 31 and 32 and the board 19b. The coefficient of friction between the conveyors 31 and 32 and the board 19b is approximately 0.3. This coefficient of friction is a value which allows a slip to occur no matter how much the acceleration of the conveyors 31 and 32 is increased, and can only realize an acceleration of approximately 0.3 G. This fact means, however, that the maximum acceleration of 0.3 G can be used as long as the acceleration of the conveyors is set to 0.3 or higher. Although the coefficient of friction is set to 0.3 in this discussion, this value is an actually measured value of a certain board, which should not be deemed to be a highly universal value.

For this reason, consideration has been given to a method of calculating a coefficient of friction from the state of acceleration and calculating deceleration starting time so that the incoming board reaches a collideable speed immediately before colliding with the stopper. Basically, after a conveyor is activated with the incoming board placed at a constant position, an acceleration of 0.5 G or higher is given to this conveyor, and a coefficient of friction or an acceleration is calculated back from the time taken for the conveyor to reach a sensor 38 placed at an appropriate distance of, for example, 50 mm. An appropriate deceleration starting time is calculated from this calculation and is used as a timer, whereby it is possible to realize board loading which takes no wasted time.

According to this mode, it is possible to greatly reduce time taken to substitute the board 19a on which components are mounted for the board 19b on which components are to be newly mounted, and it is possible to reduce the tact time necessary for a mounter merely by adding a small system. For example, it is possible to realize a 12% improvement in a mounter having a cycle time of, for example, 30 seconds.

EXAMPLES

Figure 2:
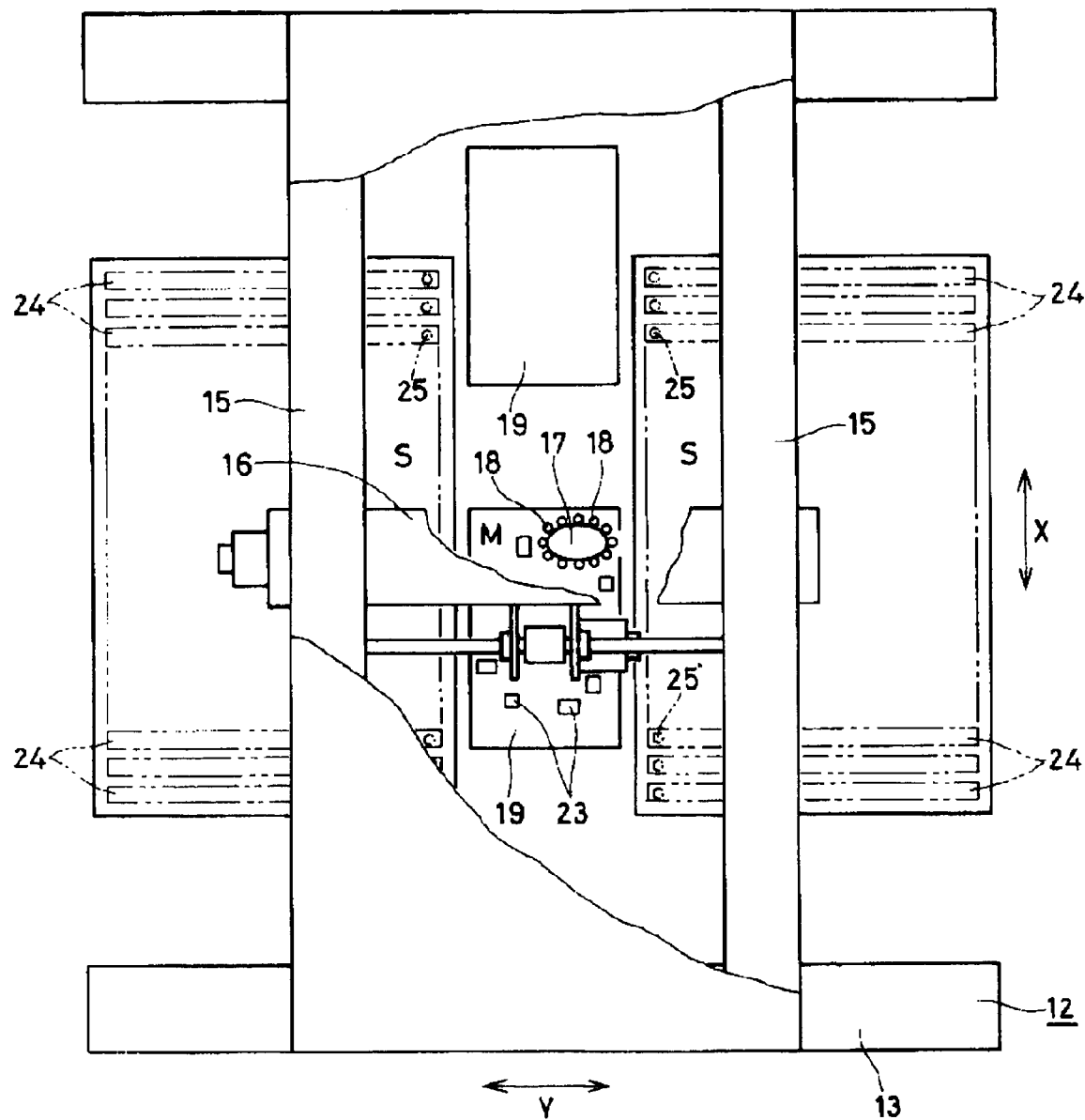
FIG. 2 is a plain view showing, partially broken out, a mounter.
Figure 3:
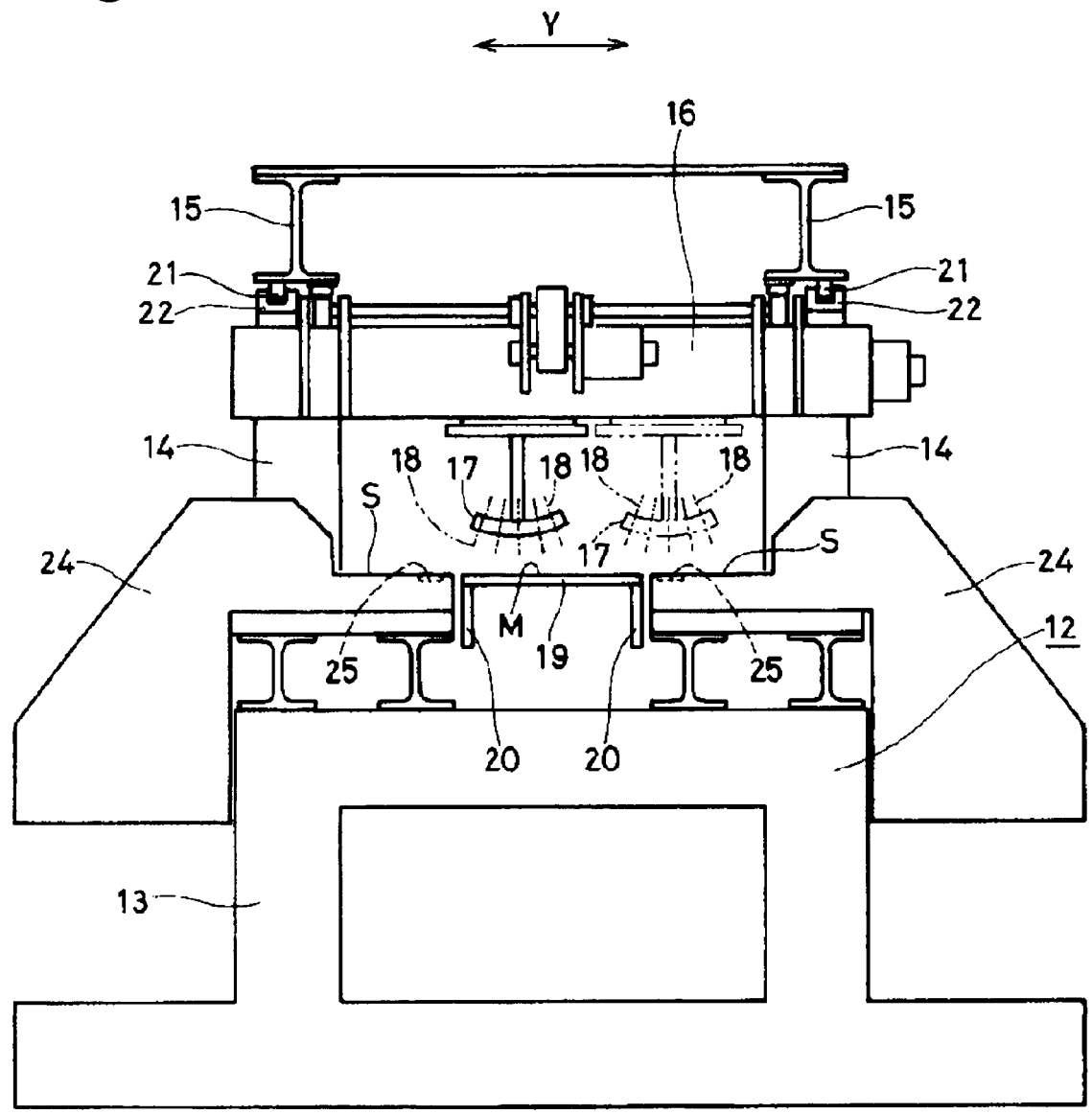
FIG. 3 is a side view showing a part of a mounter.

FIGS. 1 to 3 show the entire component mounting device according to an example of the present invention. This component mounting device includes a base unit 12, a support 13 for supporting the base unit 12, four pillars 14 respectively uprightly disposed at positions close to widthwise ends of longitudinal opposite ends for receiving the support 13 in the longitudinal direction thereof, beams 15 each supported in the form of being bridged between the top ends of two of the pillars 14 spaced apart from each other in the longitudinal direction along the lengthwise direction of the support 13, a head mounting beam 16 disposed to be bridged between the beams 15 in a suspended form, a tool head 17 suspended from the head mounting beam 16, and a plurality of suction nozzles disposed on the tool head 17. In FIGS. 1 and 2, the direction indicated by an arrow X is called longitudinal direction or X-axis direction, while in FIGS. 2 and 3, the direction indicated by an arrow Y is called widthwise direction or Y-axis direction.

A widthwise central area on the top surface of the base unit 12 is defined as a work-placing section in which a work such as a board 19 is to be placed, and fixing means 20 for fixing the circuit board 19 is disposed in the work-placing section, and the positioning of the board 19 as well as the holding of the position of the board 19 is effected by the fixing means 20. Two boards 19 are disposed in the work-placing section in the state of being spaced apart from each other by a predetermined distance in the longitudinal direction.

Guide rails 21 are respectively fixed to the bottom surfaces of the beams 15 in such a manner to extend in the X-axis direction. Guided members 22 which are respectively fixed to the top surface of the head mounting beam 16 at the opposite ends thereof are slideably engaged with the respective guide rails 21, whereby the head mounting beam 16 is supported for movement on the beams 15 along the X axis. Driving means which is not shown is provided between the head mounting beam 16 and the beams 15 so that the head mounting beam 16 runs by itself with respect to the beams 15.

The tool head 17 is provided on the head mounting beam 16 in a suspended form, and this tool head 17 is supported for movement in the Y-axis direction with respect to the head mounting beam 16. The tool head 17 is constructed to be moved in the Y-axis direction by the rotation of a ball screw provided in the inside of the head mounting beam 16.

The tool head 17 is freely movable in each of the X and Y directions by the X-axis movement of the head mounting beam 16 with respect to the beams 15 and the Y-axis movement of the tool head 17 with respect to the head mounting beam 16.

The rotating spindle of the tool head 17 is disposed in the state of being inclined with respect to the vertical direction, so that the bottom end of the tool head 17 is displaced forwardly. In addition, the tool head 17 is freely rotatable in the forward and reverse directions.

The tool head 17 has twelve suction nozzles 18 circumferentially spaced apart from each other at equal intervals around a section close to its periphery, and the axes of the suction nozzles 18 are fixed to be inclined with respect to the rotating axis of the tool head 17. The suction nozzles 18 are inclined in the direction in which the top ends of the respective suction nozzles 18 become closer to the rotating axis of the tool head 17, and the twelve suction nozzles 18 are disposed to broaden toward their bottom ends with respect to the tool head 17 as a whole.

The suction nozzles 18 are supported for movement along their respective axes with respect to the tool head 17, and when the suction nozzles 18 are positioned at an operating position which will be described later, the suction nozzles 18 are moved down by being pressed from above by pressure means which will be described later.

From among these suction nozzles 18, a suction nozzle 18 which is positioned at the rear-end side of the tool head 17 and at the right end in FIG. 1 has an axis directed in the vertical direction, and the position of the rear-end side of the axis corresponds to the operating position. Suction or release of chip components 23 is performed by the suction nozzle 18 positioned at the operating position and directed in the vertical direction.

A plurality of kinds of chip components 23 are mounted on one circuit board 19, but since suction and mounting of these different chip components 23 cannot be performed by a single kind of suction nozzle 18, a plurality of kinds of suction nozzles 18 are provided so that suction and mounting of different components is performed by optimum suction nozzles.

The suction nozzles 18 are connected to an air compressor which is not shown, and the tip of the suction nozzle 18 positioned at the operating position is switched to negative or positive pressure at a predetermined timing, whereby suction or release of the chip component 23 is performed at the tip.

An area in which to mount the chip components 23 for the board 19 positioned and held by the fixing means 20 constitutes a component mounting area M.

Forty component supply units 24 are disposed on each of the right and left sides of the component mounting area M, and a multiplicity of chip components 23 of the same kind are housed in each of the component supply units 24 and these chip components 23 are supplied to the suction nozzles 18 as required. In this description, reference is made to a construction in which the component supply units 24 are disposed on the right and left sides of the component mounting area M, but the present invention can also be applied to a construction in which the component supply units 24 are disposed on only one of the right and left sides of the component mounting area M.

Different kinds of chip components 23 are housed in the respective component supply units 24, and one of the suction nozzles 18 and one of the component supply units 24 are selected according to which position on the board 19 corresponds to a chip component 23 to be mounted, and the chip component 23 is attracted to the suction nozzle 18 by suction.

Component supply ports 25 of the respective component supply units 24 are disposed in parallel with the right and right sides of the fixing means 20, and the chip components 23 disposed in the respective component supply ports 25 are attached to the suction nozzles 18 by suction. Accordingly, an area in which these multiplicity of component supply ports 25 are arranged constitutes an area in which the chip components 23 are to be caught by suction. The area is referred to as a component supply area S.

The tool head 17 is constructed so that the suction nozzle 18 positioned at the operating position is moved in a component supply area S, the component mounting area M, and in an area connecting these areas S and M.

The tool head 17 first moves to a position above the component supply area S, and then sequentially attracts predetermined ones of the chip components 23 by suction from the twelve suction nozzles 18 provided on the tool head 17. After that, the tool head 17 moves to the component mounting area M, and sequentially mounts the components attracted to the suction nozzles 18 onto the board 19 at predetermined positions thereof while adjusting its moving position in the X-axis direction and in the Y-axis direction. By repeating this operation, the chip components 23 are mounted on the board 19.

A transfer apparatus for the boards 19 which is disposed along the transfer path of the boards 19 in this mounter will be described below with reference to FIG. 4. This transfer apparatus is provided with a pair of loading-side conveyors 31 disposed on the opposite sides, a pair of right and left conveyors 32 disposed at a processing position, and a pair of discharging-side conveyors 33. An actuator 36 provided with the ejector 35 is provided between the conveyors 32 disposed at the processing position. Furthermore, the stopper 37 is disposed on one side of the conveyors 32 at the forward ends thereof, and the sensor 38 is disposed on the inlet side of the conveyors 32.

A mechanism for moving and lifting the ejector 35 will be described below with reference to FIG. 6. A pair of cylinders 46 are respectively disposed at longitudinal front and rear positions on a frame 45 disposed approximately in parallel with the conveyors 32, and a rail 47 is supported by the output-end sides of these cylinders 46. A slider 48 is slideably secured by the rail 47. The slider 48 is connected to a belt 51 passed between pulleys 49 and 50.

Figure 6:
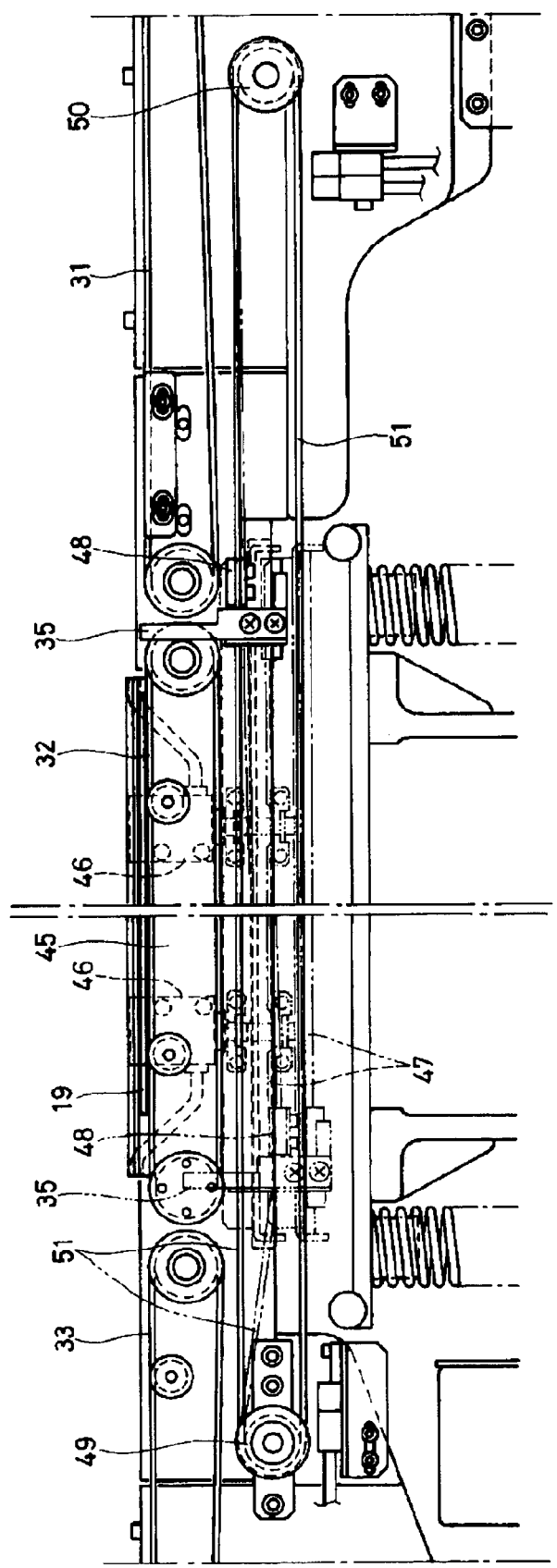
FIG. 6 is a front view showing a part of a mechanism for moving and projecting of an ejector.

Accordingly, when the belt 51 is driven, the slider 48 is reciprocally moved between the right and the left sides as viewed in FIG. 6. When the cylinders 46 are operated, the rail 47 is moved upward and downward as a whole. Accordingly, the slider 48 supported on the rail 47 is moved upward and downward, and the ejector 35 secured to the slider 48 is also moved up and down.

Figure 7:
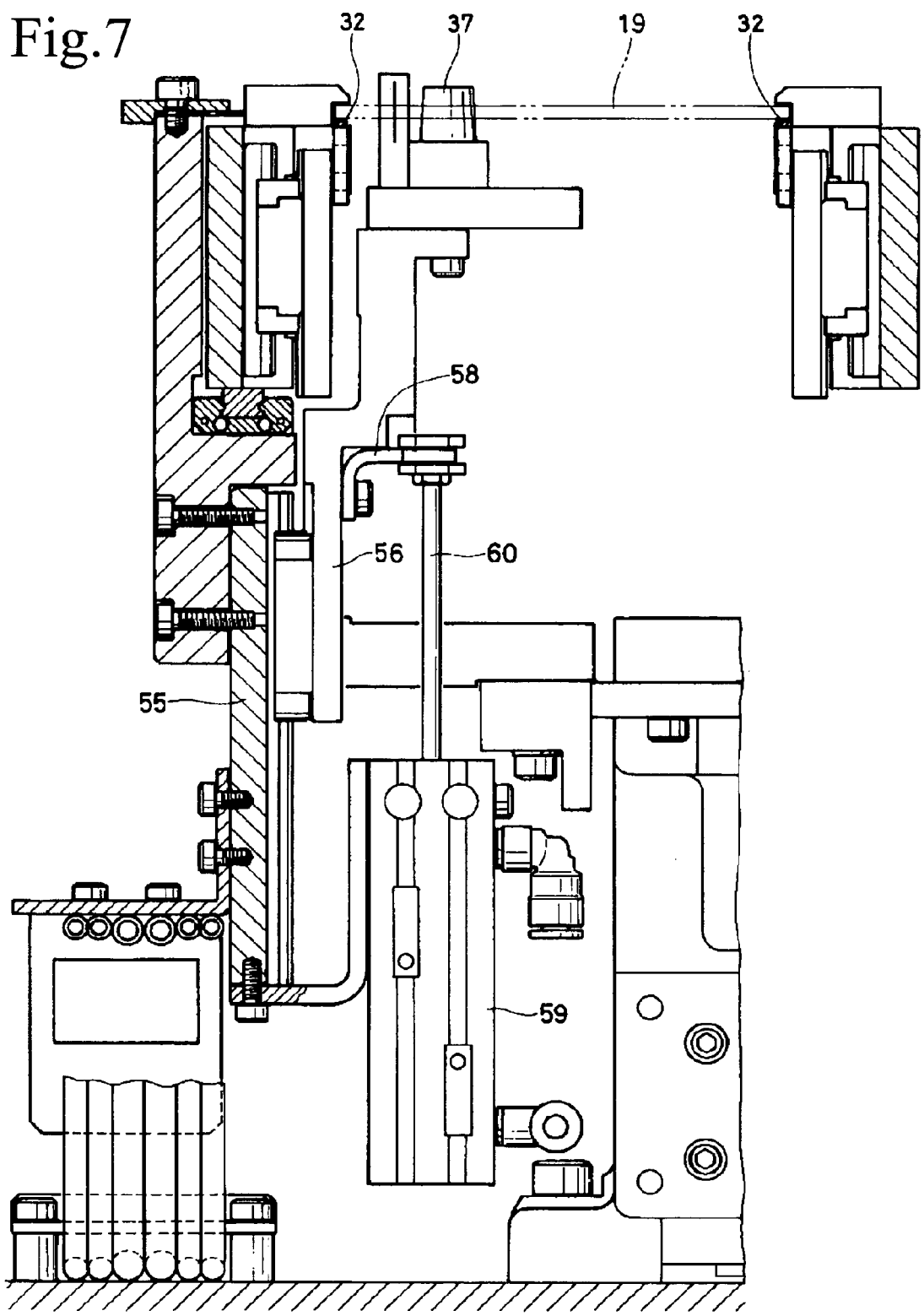
FIG. 7 is a cross-sectional view showing a mechanism for lifting of a stopper.

A mechanism for lifting the stopper 37 will be described below with reference to FIG. 7. An upright guide 55 is secured to the frame, and a movable block 56 is upwardly and downwardly slideably supported by this upright guide 55. An arm 58 is secured to the movable block 56, and the arm 58 is connected to a rod 60 of a cylinder 59.

Accordingly, when the cylinder 59 is operated, the movable block 56 is moved upward or downward via the rod 60, and the stopper 37 supported on the top end of the movable block 56 is moved between a position where the stopper 37 interferes with the board 19 and a position where the stopper 37 is retracted from the board 19.

As described above, the present embodiment is a board transfer system which is provided with the transfer belt conveyors 31, 32 and 33 divided into three parts in the transfer direction of the boards 19a and 19b and includes the ejector 35 disposed on the actuator 36 constructed to move in the flowing direction of the boards 19a and 19b, and the incoming-board stopper 37. This board transfer system has the advantage of increasing the productivity of facilities because the incoming board 19b and the outgoing board 19a can be simultaneously loaded and discharged.

Figure 4A:
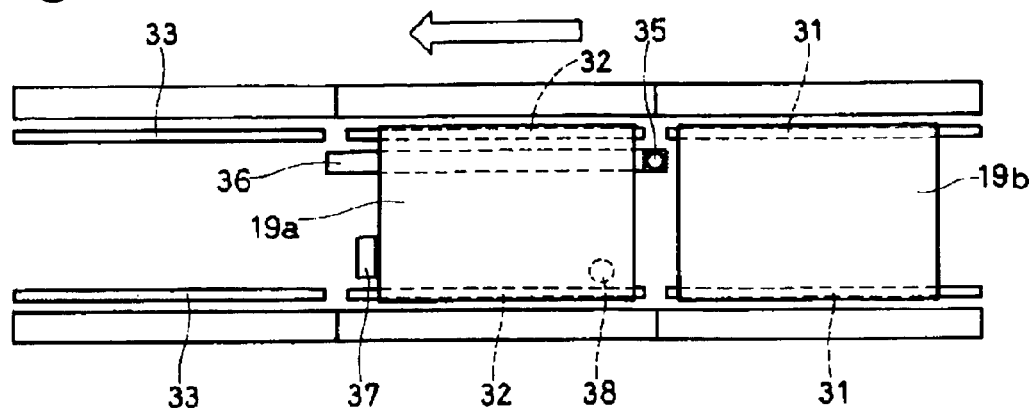
FIG. 4, consisting of FIGS. 4A to 4C, is a plain view showing a part of a different apparatus.
Figure 4B:
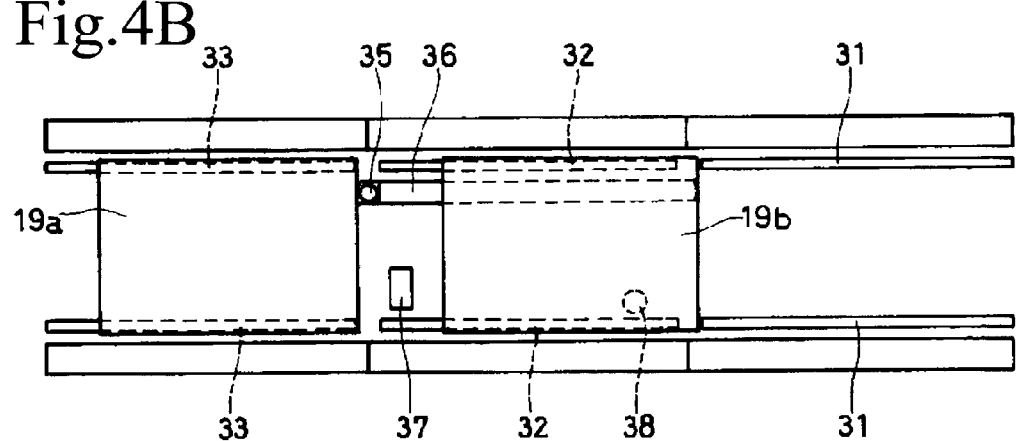
Figure 4C:
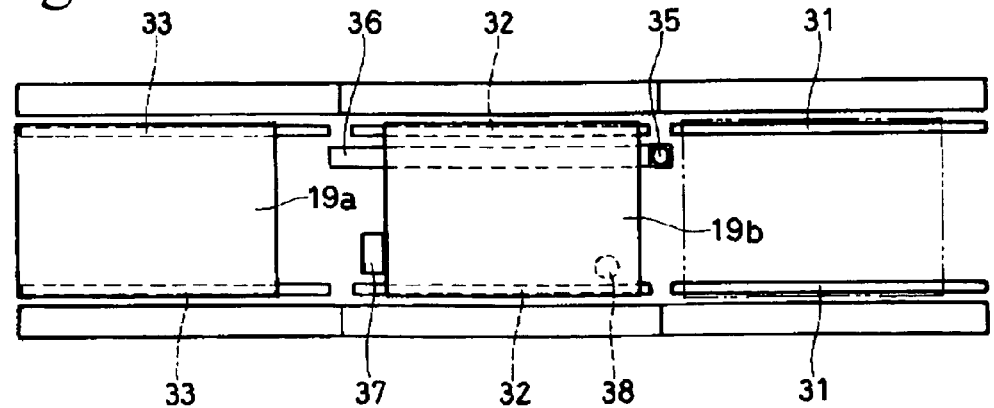

In the present embodiment in particular, as shown in FIG. 4B, the ejector 35 discharges the outgoing board 19a while moving the outgoing board 19a ahead of the incoming board 19b, and after that the incoming-board stopper 37 is projected upward. As shown in FIG. 4C, the incoming board 19b is independently decelerated and accelerated by the conveyors 31 and 32, and transfer acceleration is calculated by means of the sensor 38 and the board 19b is made to collide with the stopper 37 at an optimum speed. In this embodiment, since a transfer mechanism for the incoming board 19b is independent, even if the incoming board 19b enters late, no losses occur at all, it is possible to realize a system capable of constantly executing processing at maximum speed even in terms of either the discharging of the board 19a or the loading of the board 19b.

More specifically, as shown in FIG. 4, the actuator 36 which is driven in the flowing direction of the boards 19a and 19b is added to the board transfer belt conveyors 31, 32 and 33 divided into three parts in the transfer direction. The ejector 35 is disposed on the actuator 36, and the ejector 35 is projected in the space between the outgoing board 19a and the incoming board 19b. The projection and retraction of the ejector 35 is performed by the pair of cylinders 46 shown in FIG. 6, and the movement of the ejector 35 is performed by the belt conveyor 51.

As shown in FIG. 4B, the actuator 36 causes the ejector 35 and the outgoing board 19a to move at a faster acceleration and speed than those of the conveyors 32 and 33, and when this ejector 35 transfers the outgoing board 19a to a position where the stopper 37 of the incoming board 19b can be moved upward, the stopper 37 is moved upward. The upward movement of the stopper 37 is performed by moving the movable block 56 on the upright guide 55in the upward direction by means of the cylinder 59 shown in FIG. 7.

The reason why the stopper 37 can move upward without interfering with the incoming board 19b is that since the speed and the acceleration of the ejector 35 are higher than those of the conveyors 31 and 32, the ejector 35 can separate the incoming board 19b from the outgoing board 19a and ensure a space enough for the stopper 37 to move upward in.

Otherwise, the width of the ejector 35 in the moving direction thereof and the speed of the ejector 35 may be adjusted to allow the stopper 37 to move upward within the time during which the ejector 35 is passing through the position lateral to the stopper 37.

In addition, if the incoming board 19b is made to stop at a fixed position as shown in FIG. 4A and measurement is performed on the time required for the incoming board 19b to reach the sensor 31 disposed at an appropriate distance while the conveyors 31 are being operated at not lower than a certain acceleration, the transfer acceleration of the board 19b can be calculated. By setting an appropriate board transfer speed deceleration timer which the incoming board 19b reaches a collideable speed immediately before colliding with the incoming-board stopper 37 on the basis of that calculation, it is possible to realize board loading free of wasted time.

Figure 5A:
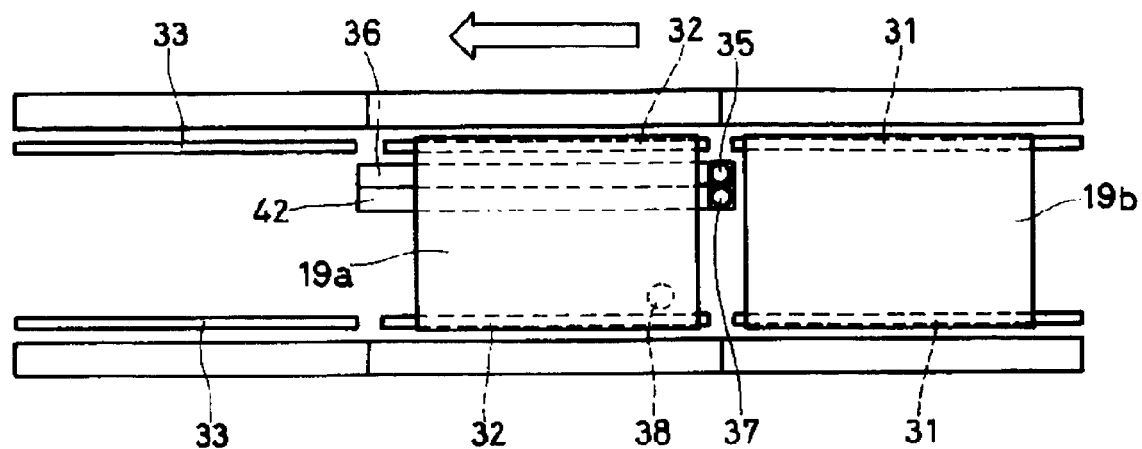
FIG. 5, consisting of FIGS. 5A to 5B, is a plain view showing a part of a different type of a board transfer apparatus.
Figure 5B:
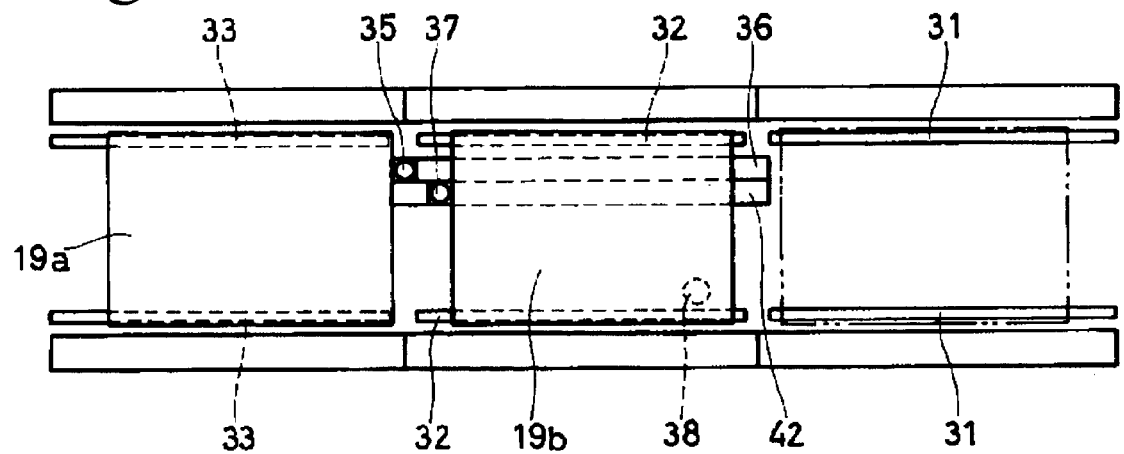

Another embodiment will be described below with reference to FIG. 5. This embodiment is constructed so that not only the ejector 35 but also the stopper 37 is moved by an actuator 42. Namely, as shown in FIGS. 5A and 5B, separation of the two boards 19a and 19b is performed by the ejector 35 and the stopper 37 when both the ejector 35 and the stopper 37 are positioned between the outgoing board 19a and the incoming board 19b. In this case, the stopper 37 functions as a stopper for the incoming board 19b and is positioned to stop the incoming board 19b at the operating position as shown in FIG. 5B. Then, the outgoing board 19a is discharged by the ejector 35. This construction provides the merit of removing limitations from the mutual relationship in acceleration and speed between the conveyors 31, 32 and 33 and the two kinds of actuators 36 and 42.

Although the invention of the present application has been described with reference to the mode for carrying out the invention as well as the embodiments, the present invention is not limited to any of the modes for carrying out the invention and the embodiments, and various modifications can be made without departing from the scope of the technical idea of the invention included in the present application. For example, although the above-mentioned mode is related to transfer of circuit boards in a component mounter, the present invention can be widely used for transfer of various other works. The construction of the actuator shown in FIG. 6, the lifting mechanism for the stopper shown in FIG. 7 and the like can be variously changed in design to meet various objects.

What is claimed is:

1. A work transfer apparatus configured to move an incoming work to an operating position while transferring the work with a conveyor to perform predetermined processing on the incoming work at the operating position, and discharge a processed work as outgoing work, the work transfer apparatus comprising:

a conveyor;

an ejector moving the incoming work independently from the conveyor; and a stopper stopping the incoming work at the operating position, wherein the work processed by the predetermined processing is discharged by the ejector as outgoing work, and another work to be next moved to the operating position by the conveyor is stopped at the operating position by the stopper, wherein the ejector is supported to allow free movement on a rail that is disposed to extend in a running direction of the conveyor and is moved on the rail by reciprocating motion of a belt, and the rail is displaced in a direction crossing the conveyor by an actuator in such a way that the ejector is projected at a position where the ejector engages with the work.

2. The work transfer apparatus according to claim 1, wherein a discharging speed at which the incoming work processed by the predetermined processing is discharged by the ejector as outgoing work is set to be larger than a moving speed of the next incoming work to be moved to the operating position by the conveyor.

3. The work transfer apparatus according to claim 1, wherein the discharging speed at which the incoming work processed by the predetermined processing is discharged as outgoing work by the ejector is set to be larger than a transfer speed of a next incoming work by the conveyor in such a way that a space is provided between the processed outgoing work and the next incoming work to be processed and the stopper is inserted into the space.

4. The work transfer apparatus according to claim 3, wherein the transfer speed of the next incoming work to be processed is accelerated and decelerated independently by the conveyor, and the next incoming work is made to stop by coming into abutment with the stopper.

5. The work transfer apparatus according to claim 1, wherein the stopper is disposed at a predetermined position in a transfer path of the incoming work moved by the conveyor, and the stopper is displaced in a direction crossing the conveyor by the actuator in such a way that the stopper is projected at a position where the stopper comes into abutment with the incoming work.

6. A work transfer apparatus configured to move an incoming work to an operating position while transferring the incoming work with a conveyor to perform predetermined processing at the operating position, and discharge a processed work as outgoing work, the work transfer apparatus comprising:

an ejector moving the incoming work independently from the conveyor; and a stopper stopping the incoming work moved independently from the conveyor and transferred to the operating position, wherein the incoming work processed by the predetermined processing is discharged as outgoing work by the ejector, and the stopper is moved between the incoming work processed by the predetermined processing as outgoing work and a next incoming work to be transferred to the operating position to stop the next incoming work to be transferred to the operating position at a predetermined operating position, wherein the ejector and the stopper are respectively supported so as to allow free movement on rails that are disposed to extend in a running direction of the conveyor and are respectively moved on the rails by reciprocating motion of belts, and the respective rails are displaced in directions crossing the conveyor by actuators in such a way that the ejector and the stopper are respectively projected at positions where the ejector and the stopper engage with the incoming work.

7. The work transfer apparatus according to claim 6, wherein the ejector and the stopper move at mutually independent speeds.

8. The work transfer apparatus according to claim 1 or 6, wherein the incoming work is a circuit board, and a component is mounted on the circuit board at the operating position to constitute the outgoing work.

* * * * *